United States Patent
Wu et al.

(10) Patent No.: US 10,628,247 B2
(45) Date of Patent: Apr. 21, 2020

(54) FLASH MEMORY TESTING ACCORDING TO ERROR TYPE PATTERN

(71) Applicants: LITE-ON ELECTRONICS (GUANGZHOU) LIMITED, Guangzhou (CN); LITE-ON TECHNOLOGY CORPORATION, Taipei (TW)

(72) Inventors: Tsung-Hung Wu, Taipei (TW); Sin-Yu Lin, Taipei (TW)

(73) Assignee: SOLID STATE STORAGE TECHNOLOGY CORPORATION, Taipei (TW)

( * ) Notice: Subject to any disclaimer, the term of this patent is extended or adjusted under 35 U.S.C. 154(b) by 247 days.

(21) Appl. No.: 15/921,738

(22) Filed: Mar. 15, 2018

(65) Prior Publication Data
US 2019/0196896 A1 Jun. 27, 2019

(30) Foreign Application Priority Data
Dec. 21, 2017 (CN) .......................... 2017 1 1395467

(51) Int. Cl.
| | |
|---|---|
| G06F 11/07 | (2006.01) |
| G11C 29/50 | (2006.01) |
| G11C 7/04 | (2006.01) |
| G11C 29/10 | (2006.01) |
| G11C 16/34 | (2006.01) |
| G06F 11/263 | (2006.01) |

(52) U.S. Cl.
CPC ........ *G06F 11/0727* (2013.01); *G06F 11/079* (2013.01); *G06F 11/263* (2013.01); *G11C 7/04* (2013.01); *G11C 16/3404* (2013.01); *G11C 29/10* (2013.01); *G11C 29/50004* (2013.01); *G11C 29/50016* (2013.01)

(58) Field of Classification Search
CPC ............... G06F 11/0727; G06F 11/079; G06F 11/2221; G06F 11/24; G06F 11/263; G06F 11/2635; G11C 7/04; G11C 16/34; G11C 16/3404; G11C 16/3418; G11C 16/3431; G11C 16/349; G11C 29/10; G11C 29/14; G11C 29/16; G11C 2029/3602; G11C 29/44; G11C 29/46; G11C 29/50; G11C 29/50004; G11C 29/0016
See application file for complete search history.

(56) References Cited

U.S. PATENT DOCUMENTS

| | | | |
|---|---|---|---|
| 8,503,238 B1 * | 8/2013 | Wu | G11C 16/06 365/185.09 |
| 9,401,222 B1 * | 7/2016 | Eckert | G11C 29/10 |
| 9,761,308 B1 * | 9/2017 | Cometti | G11C 29/52 |
| 10,146,612 B1 * | 12/2018 | Buckner | G06F 11/0793 |

(Continued)

*Primary Examiner* — Gabriel Chu
(74) *Attorney, Agent, or Firm* — McClure, Qualey & Rodack, LLP

(57) ABSTRACT

A storage method comprises storing a retry table; wherein the retry table recites a plurality of error type patterns, the error type patterns comprises a plurality of default error types; accessing data stored in the flash memory; wherein an access error caused when a control circuit reads the data, the control circuit reads the retry table and performs testing according to the error type patterns sequentially to determine a current error type of the access error, and the control circuit performs an adjusted accessing action according to the current error type.

12 Claims, 4 Drawing Sheets

(56) References Cited

U.S. PATENT DOCUMENTS

2006/0227634 A1* 10/2006 Loh .................. G11C 29/50
                                                                            365/201
2017/0249206 A1* 8/2017 Jeong ............... G06F 11/0793
2018/0210782 A1* 7/2018 Gao .................. G06F 3/065

* cited by examiner

FLASH MEMORY TESTING ACCORDING TO ERROR TYPE PATTERN

This application claims the benefit of People's Republic of China application Serial No. 201711395467.0, filed on Dec. 21, 2017, the subject matter of which is incorporated herein by reference.

BACKGROUND

Field of Invention

The present invention relates to a storage system and a storage method. More particularly, the present invention relates to a storage system and a storage method where the flash memories are used as the mass data storage device.

Description of Related Art

Flash memory is a type of non-volatile memory that allows user to erase data or write data multiple times during an operation. Flash memory stores data in a memory cell array composed of floating-gate transistors. In a single-level cell (SLC) device, each cell stores only 1-bit information. Multi-level cell (MLC) devices use a variety of charge levels to allow each cell to store more than one bit (for example, two bits) of data.

However, the flash memory has a limit on the number of erase cycles. By the way, if the same page of data in the flash memory is read too frequently in a period of time, it will result in a change in the charges of the floating-gates of memory cells in the same block or in the adjacent block. A data read error maybe occurred while the data was being accessed under such conditions.

Therefore, how to provide a storage system and a storage method that can provide a better error-recovery response when the storage system is encountered a read error and then increase the overall performance has become an urgent problem in the art.

SUMMARY

One aspect of the present disclosure is related to a storage system. The storage system comprises a flash memory and a controller. The controller is coupled to the flash memory. The controller comprises a storage device and a control circuit. The storage device stores a retry table. The retry table recites a plurality of error type patterns, the error type patterns comprise a plurality of default error types. The control circuit accesses data stored in the flash memory. If an access error is occurred when the control circuit reads the data, the control circuit will read the retry table and performs testing according to the error type patterns sequentially to determine a current error type of the access error, and the control circuit performs an adjusted accessing action according to the current error type.

Another aspect of the present disclosure is related to a storage method. In accordance with one embodiment of the present disclosure, the storage method comprise storing a retry table; wherein the retry table recites a plurality of error type patterns, the error type patterns comprises a plurality of default error types; accessing data stored in the flash memory; wherein an access error occurred when a control circuit reads the data, the control circuit reads the retry table and performs testing according to the error type patterns sequentially to determine a current error type of the access error, and the control circuit performs an adjusted accessing action according to the current error type.

In summary, the storage system and the storage method shown in the present invention can define various error type patterns in advance through the retry table. When a data access error occurs, the control circuit can test each of the retry set of voltage shift values in sequence until the voltage shift value corresponding to the current error type is found, and according to the current error type pattern, the corresponding error recovery action will be performed. For example, the control circuit moves the repaired data to other memory blocks to avoid using bad memory blocks, or move the repaired data to the cache memory to reduce the access loading of the flash memory, or based on the adjusted accessing voltage to read future data in the same page. That is, reading the data in the same page of the flash memory, the control circuit can directly read this data with the adjusted accessing voltage and reduce the number of searching the retry table. Therefore, the present invention achieves improving the speed of reaction in the event of an error in the storage system and provides a repair mechanism, thereby increasing the overall performance.

DETAILED DESCRIPTION OF DISCLOSED EMBODIMENTS

Figure 1:
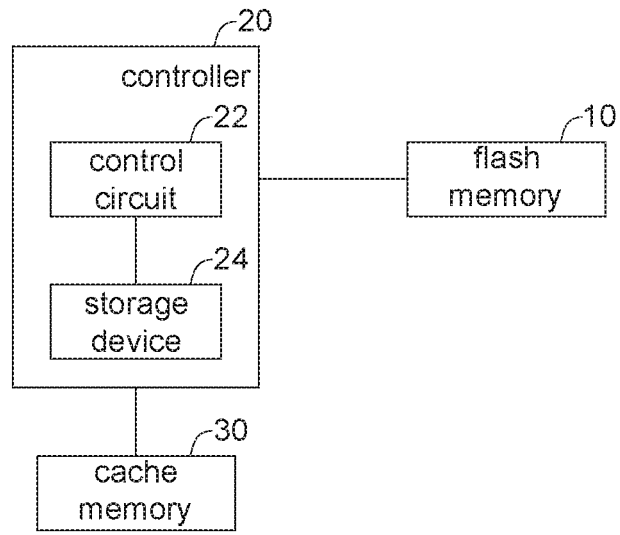
FIG. 1 is a block diagram of a storage system 100 according to one embodiment of the present invention.

Reference will now be made in detail to the present embodiments of the invention, examples of which are illustrated in the accompanying drawings. Wherever possible, the same reference numbers are used in the drawings and the description to refer to the same or like parts.

Figure 2:
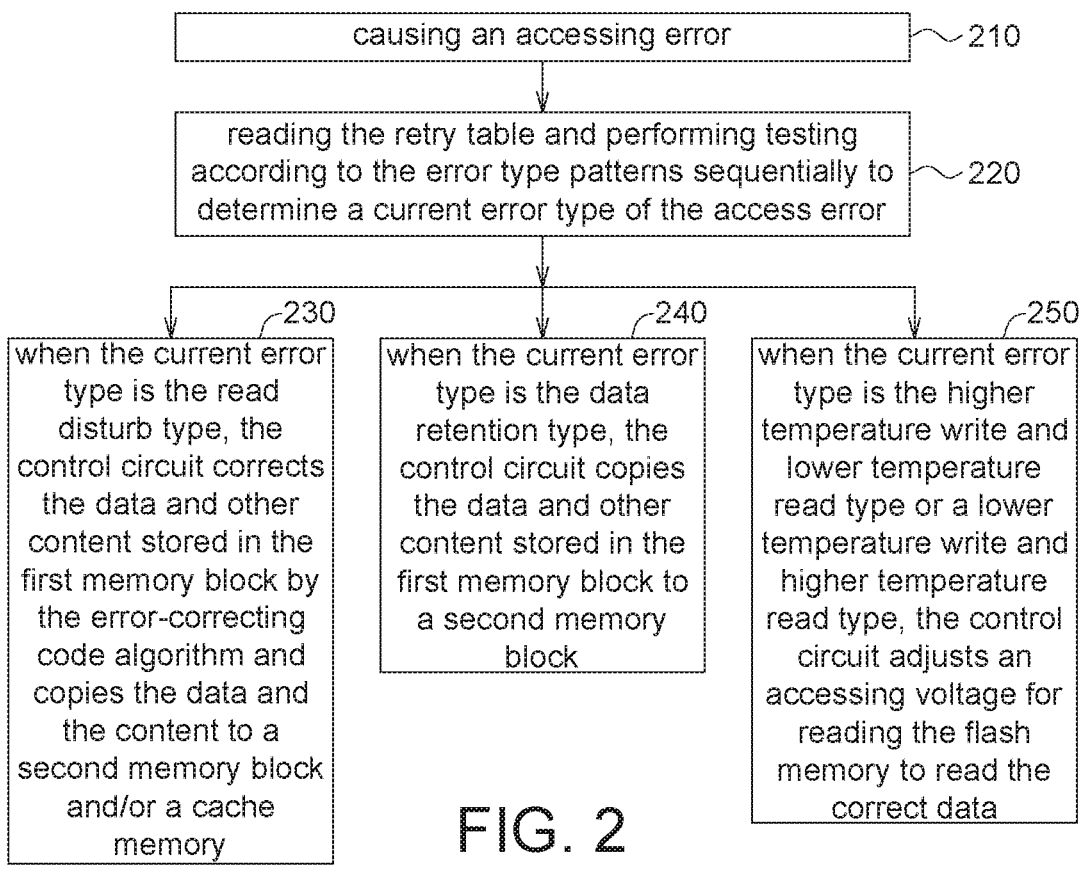
FIG. 2 is a flowchart of a storage method 200 according to one embodiment of the present invention.

It will be understood that, although the terms "first," "second," "current," etc. may be used herein to describe various elements, these elements should not be limited by these terms. These terms are only used to distinguish one element from another. Reference is made to FIG. 1 and FIG. 2. FIG. 1 is a block diagram of a storage system 100 according to one embodiment of the present invention. FIG. 2 is a flowchart of a storage method 200 according to one embodiment of the present invention.

In one embodiment, the storage system 100 comprises a flash memory 10 and a controller 20. The controller 20 further comprises a control circuit 22 and a storage device 24. The controller 20 is coupled to the flash memory 10. In one embodiment, the storage system 100 further comprises a cache memory 30.

In one embodiment, the controller 20 can be a computer, a server or other electronic device having computation and storage function.

In one embodiment, the control circuit 22 can be implemented by a microcontroller, a microprocessor, a digital signal processor, an application specific integrated circuit (ASIC), or a logic circuit.

In one embodiment, the storage device 24 can be implemented by memory, hard disk, memory card, or a storage medium having the same function, etc.

In one embodiment, the flash memory 10 can be implemented by NAND flash memory or other type flash memory (e.g., NOR flash memory). For convenience, the flash memory 10 described below in this document refers to a NAND flash memory. However, it is not limited thereto.

In one embodiment, the cache memory 30 can be implemented by dynamic random access memory (DRAM) or static random access memory (SRAM).

In one embodiment, the storage device 24 stores a retry table. The retry table recites multiple error type patterns. These error type patterns include multiple default error types. In one embodiment, the retry table is shown as Table 1.

In one embodiment, the default error type comprises a data retention type, and/or a read disturb type, and/or a higher temperature write and lower temperature read type.

The data retention type represents that the error caused by reading the data which was written in a long time ago (for example, 14 days). Since the time interval between writing and reading is so long, the electrons in the floating gates of the flash memory 10 are likely to drift. The longer the time interval is, the more obvious the shifting state is, so resulting in access errors.

The read disturb type represents that after the data is written to certain page of the flash memory 10, then the data is frequently read in a short period of time (for example, the number of times of reading is more than 100,000 times in one second), and resulting in access errors.

TABLE 1

| Storing status | Default shift value | Read disturb type | | | Higher temperature write and lower temperature read type | | | Data retention type | | |
|---|---|---|---|---|---|---|---|---|---|---|
| A | 0 | +3 | +9 | +15 | +6 | −16 | +12 | −15 | +4 | −9 |
| B | 0 | +10 | +14 | +16 | +10 | +16 | +20 | −15 | −11 | −10 |
| C | 0 | +7 | +10 | +5 | +11 | +20 | +15 | +3 | −7 | 0 |
| D | 0 | +10 | +6 | +10 | +14 | +10 | +14 | −10 | −7 | −9 |
| E | 0 | +5 | +10 | +7 | +16 | +4 | +10 | −5 | −4 | −6 |
| F | 0 | +0 | +1 | +4 | +5 | +10 | +10 | −5 | −3 | −12 |
| G | 0 | +24 | +25 | 0 | +10 | +10 | −15 | −10 | +40 | 0 |

In Table 1, each column besides the "storing status" column specifics an error type pattern. The "default shift value" column sets each storing status A-G as zero. The "read disturb type" column, the "higher temperature write and lower temperature read type" columns, the "data retention type" columns are used to determine different error conditions, by adjusting the shift status (i.e., the voltage shift values in Table 1) of flash memory 10 when reading data from it.

In one embodiment, when the flash memory 10 is triple-level cell (TLC), the flash memory 10 can show multiple storing status A-G (i.e., the electronic unit shift status) depending on the amount of hot carrier injection.

However, the present invention is not limited to the flash memory 10 of TLC type. The present invention also can be applied to the flash memory 10 of the single-level cell (SLC) type, the multi-level cell (MLC) type, the quad-level cell (QLC) type, etc.

The following description will be further described based on Table 1. However, it should be understood by those of ordinary skill in the art that Table 1 is merely an example, and the present invention is not limited to the samples and values shown in Table 1.

The various steps of the storage method 200 are described in detail below. The components mentioned in the storage method 200 may be implemented by the above components described in FIG. 1.

In step 210, the control circuit 22 causes an access error when reading data. In one embodiment, the control circuit 22 reads the data stored in the flash memory 10. When the control circuit 22 reads the data causing error, for example, the data is incomplete, the data content is corrupted, lost or damaged, and the step 210 is triggered.

In step 220, the control circuit 22 reads the retry table (Table 1 is taken as an example in below) and performs testing according to the error type patterns sequentially to determine a current error type of the access error.

The higher temperature write and lower temperature read type represents writing data at high temperatures and reading data at low temperatures. For example, room temperature is 25 degrees Celsius, high temperature is above 50 degrees Celsius environment temperature, low temperature is below 0 degrees Celsius environment temperature. Since the environment temperature difference between the read and write is too big, the electrons of the flash memory 10 may shift and cause access errors. On the other hand, the error type may also have a lower temperature write and higher temperature read type, which means writing data at a low temperature and reading data at a high temperature. It will also cause electron shift of the flash memory 10 and cause access errors. Because of the similarities between the higher temperature write and lower temperature read type and the lower temperature write and higher temperature read type, the following description is given by taking the higher temperature write and lower temperature read type as an example.

In one embodiment, when the control circuit 22 reads the retry table, the control circuit 22 adjusts an accessing voltage for reading the flash memory 10 according to a plurality sets of voltage shift values in the error type pattern, and the control circuit 22 performs testing by reading the data adjusted by each set of the voltage shift values sequentially until the control circuit 22 reads the correct data. When the control circuit 22 reads the correct data, the control circuits 22 determines the current error type of the accessing error according to the corresponding error type pattern having the set of the voltage shift values that generated the correct data.

In one embodiment, the retry table is taken Table 1 for example, the values of each column is a set of voltage shift value. For example, the values (+3, +10, +7, +10, +5, +0, +24) of the first column of the "read disturb type" columns is called a set of voltage shift value. These seven values separately correspond to the storing status A, B, C, D, E, F and G. For another example, the values (+6, +10, +11, +14, +16, +5, +10) of the first column of the "higher temperature write and lower temperature read type" columns is another set of voltage shift value. These seven values separately correspond to the storing status A, B, C, D, E, F and G.

According to Table 1, the error types mentioned before (e.g., a data retention type, a read disturb type or a higher temperature write and lower temperature read type) have a corresponding relationship with the voltage shift values. The effect of these voltage shift values on storing status is described below.

In one embodiment, reference is made to FIGS. 3A-3D. FIGS. 3A-3D are schematic diagrams of voltage shift according to one embodiment of the present invention.

Figure 3A:
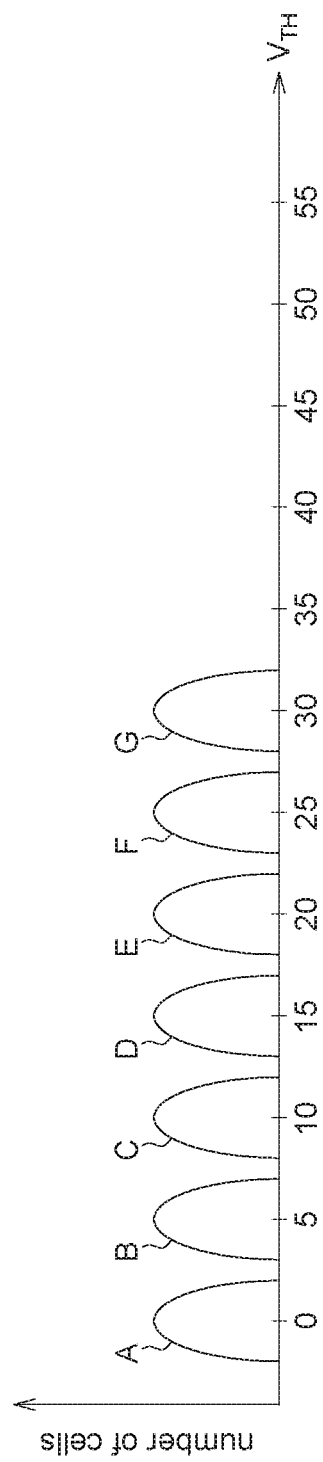
FIGS. 3A-3D are schematic diagrams of voltage shift according to one embodiment of the present invention.

In FIG. 3A, in the initial programming cycle, if a plurality of memory cells are programmed to the same storage state, not every memory cell has the same threshold voltage but a distribution curve, and its distribution curve has an X-axis corresponding to a median threshold voltage $V_{TH}$, Y axis corresponding to the number of cells, assuming the number of cells are the same. According to FIG. 3A, the median threshold voltages $V_{TH}$ of storing states A, B, C, D, E, F and G are (0, 5, 10, 15, 20, 25, 30). The unit is volts (V).

Figure 3B:
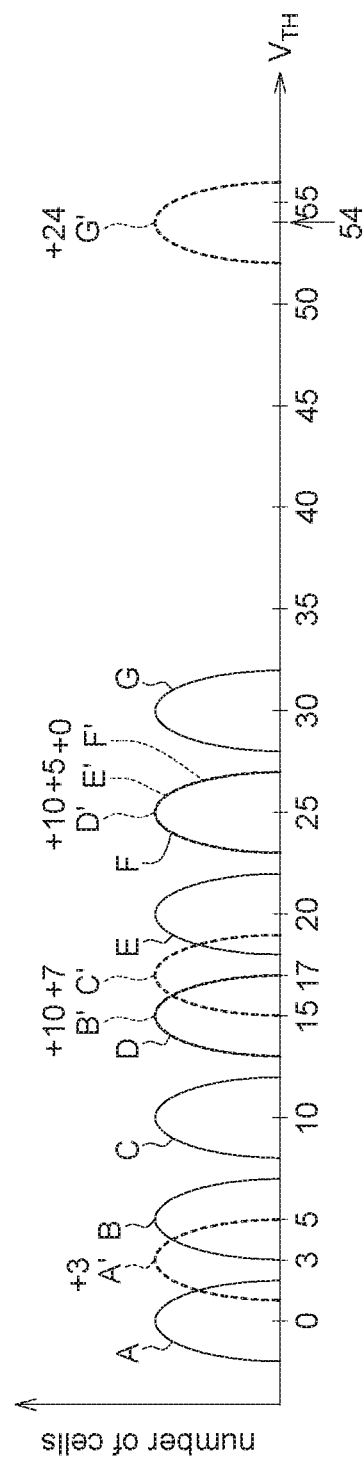

In FIG. 3B, the default shift values in the storing states A, B, C, D, E, F and G are all zero, and the current error type is the first column voltage shift values of the "read disturb type" columns. The voltage shift values (+3, +10, +7, +10, +5, +0, +24) of the first column and the median threshold voltage $V_{TH}$ of the storing states A, B, C, D, E, F and G are respectively added to obtain adjusted median threshold voltage $V_{TH}$ of the storing state A', B', C', D', E', F' and G' (3, 15, 17, 25, 25, 25, 54).

Figure 3C:
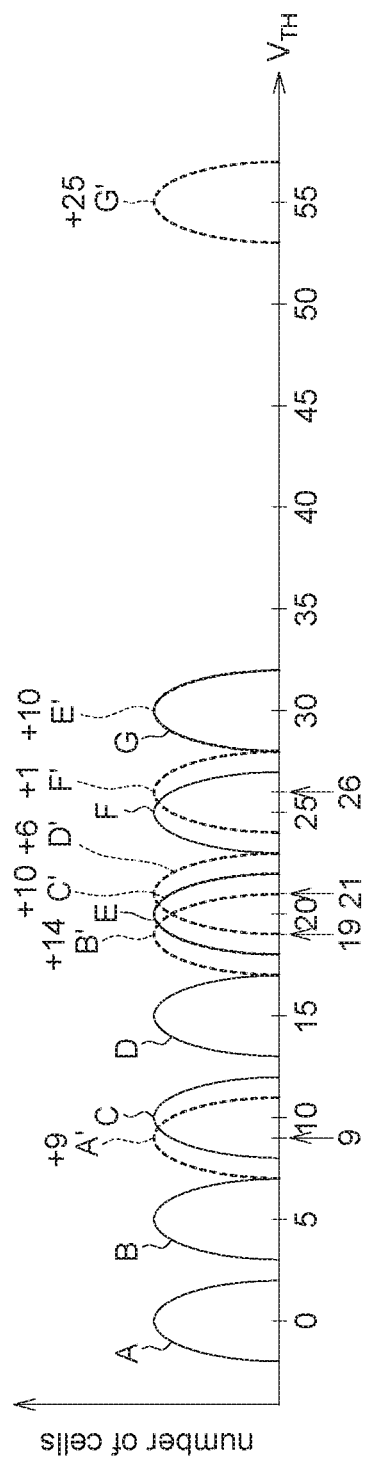

Similarly, in FIG. 3C, the default shift values in the storing states A, B, C, D, E, F and G are all zero, and the current error type is the second column voltage shift values (+9, +14, +10, +6, +10, +1, +25) of the "read disturb type" columns. The voltage shift values (+9, +14, +10, +6, +10, +1, +25) of the second column and the median threshold voltage $V_{TH}$ of the storing states A, B, C, D, E, F and G are respectively added to obtain adjusted median threshold voltage $V_{TH}$ of the storing state A', B', C', D', E', F' and G' (9, 19, 20, 21, 30, 26, 55).

Figure 3D:
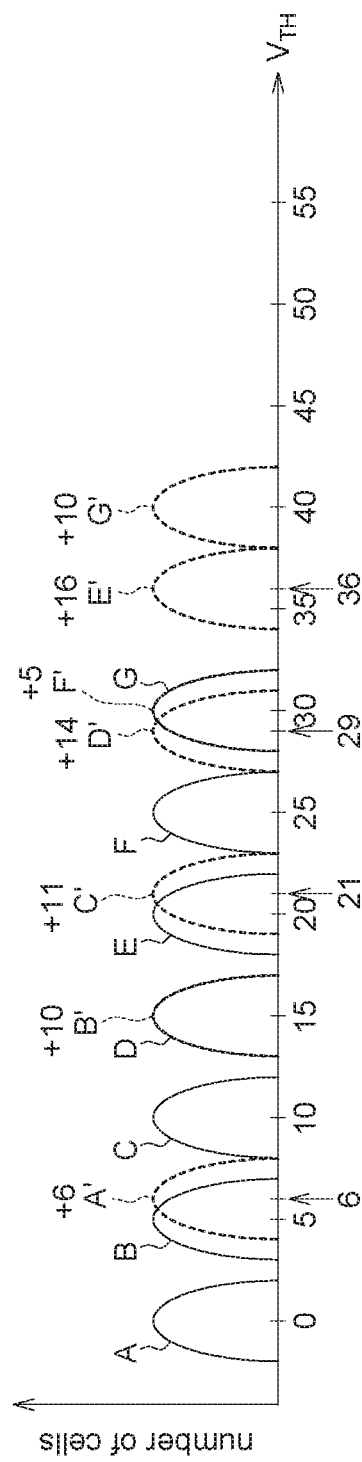

Similarly, in FIG. 3D, the default shift values in the storing states A, B, C, D, E, F and G are all zero, and the current error type is the first column voltage shift values (+6, +10, +11, +14, +16, +5, +10) of the "higher temperature write and lower temperature read type" columns. The voltage shift values (+6, +10, +11, +14, +16, +5, +10) of the first column and the median threshold voltage $V_{TH}$ of the storing states A, B, C, D, E, F and G are respectively added to obtain adjusted median threshold voltage $V_{TH}$ of the storing state A', B', C', D', E', F' and G' (6, 15, 21, 29, 36, 30, 40).

As such, when an access error occurs, the control circuit 22 reads the retry table, and tests the voltage shift values in a set (that is, in a column) to adjust an accessing voltage for reading the flash memory 10, and read the data by the accessing voltage. For example, the control circuit 22 reads the first column voltage shift values (+3, +10, +7, +10, +5, +0, +24) of the "read disturb type" columns and sets the median threshold voltage $V_{TH}$ (3, 15, 17, 25, 25, 25, 54) as accessing voltage for reading the data. If the read data is still wrong, then the control circuit 22 tests the second column voltage shift values (+9, +14, +10, +6, +10, +1, +25) of the "read disturb type" columns, and sets the median threshold voltages $V_{TH}$ (9, 19, 20, 21, 30, 26, 55) as accessing voltage for reading the data. If the read data is still wrong, then the control circuit 22 tests the third column voltage drift values . . . and so on. In this way, the voltage shift values of each set are sequentially tested until the control circuit 22 reads the correct data (for example, when the accessing voltage is (6, 15, 21, 29, 36, 30, 40), the control circuit 22 can obtain the correct data), then the correct data will be generated based on the voltage drift values of the set (that is, the first column voltage drift values of the "higher temperature write and lower temperature read type" columns), and the corresponding error type pattern (i.e., the higher temperature write and lower temperature read type) is determined as the current error type causing access error.

In one embodiment, the control circuit 22 performs an adjusted accessing action according to the current error type. For example, the control circuit 22 performs the step 230 when the current error type is read disturb type, performs the step 240 when the current error type is the data retention type, and performs the step 250 when the current error type is higher temperature write and lower temperature read type or lower temperature write and higher temperature read type.

In step 230, when the current error type is the read disturb type, the control circuit 22 corrects the data and other content stored in the first memory block by the error-correcting code (ECC) algorithm and copies the data and the content to a second memory block and/or a cache memory 30.

Figure 4:
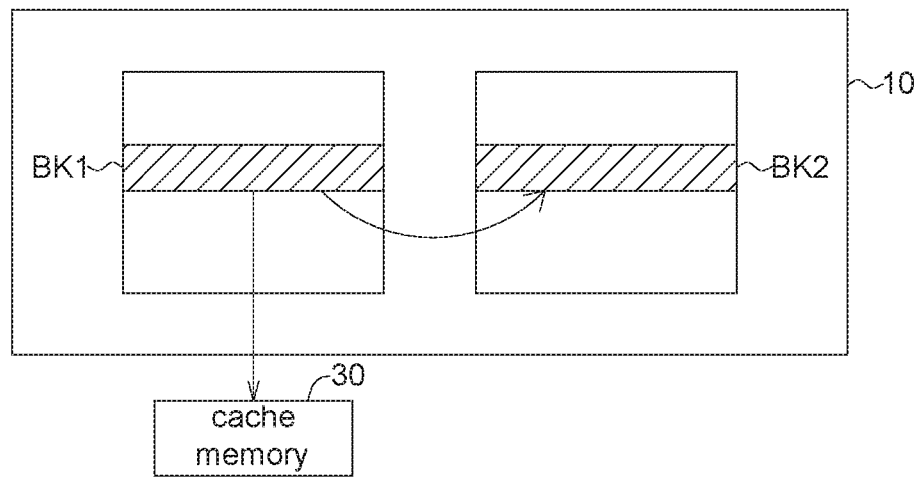
FIG. 4 is a schematic diagram of adjusting accessing action according to one embodiment of the present invention.

In one embodiment, reference is made to FIG. 4. FIG. 4 is a schematic diagram of adjusting accessing action according to one embodiment of the present invention. In FIG. 4, when the current error type is the read disturb type, the control circuit 22 corrects the data and other content stored in the memory block BK1 of the flash memory 10 by the error-correcting code (ECC) algorithm and copies the data and the content to a memory block BK2 and/or a cache memory 30.

The read disturb type represents that the data is read frequently after the data is written. By storing the repaired data into the cache memory 30, the control circuit 22 frequently accesses the cache memory 30 to obtain the correct data. The cache memory 30 has high readability, and the cache memory 30 has high tolerance under a large amount data accessing, so as to reduce the loading of the flash memory 10. Besides, when the data stored in the cache memory 30 disappears due to the power interruption, the control circuit 22 can still obtain the correct data from the memory block BK2. In other words, the memory block BK2 can be used to backup data.

In step 240, when the current error type is the data retention type, the control circuit 22 copies the data and other content stored in the first memory block to a second memory block.

Figure 5:
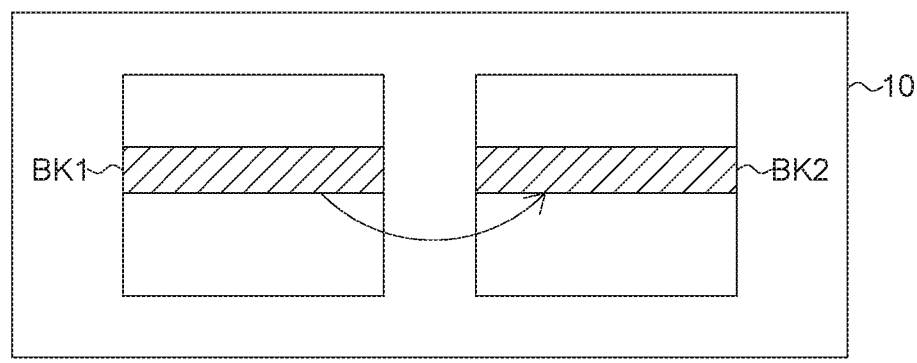
FIG. 5 is a schematic diagram of adjusting accessing action according to one embodiment of the present invention.

In one embodiment, reference is made to FIG. 5. FIG. 5 is a schematic diagram of adjusting accessing action according to one embodiment of the present invention. In FIG. 5, when the current error type is the data retention type, the control circuit 22 copies the data and other content stored in the memory block BK1 (e.g., the damaged block) to a memory block BK2. When the data is read next time, the control circuit 22 obtains the correct data directly from the memory block BK2.

In step 250, when the current error type is the higher temperature write and lower temperature read type or a lower temperature write and higher temperature read type, the control circuit 22 adjusts an accessing voltage for reading the flash memory 10 to read the correct data.

For example, as shown in FIG. 3D, after calculating the voltage shift values of storing status A', B', C', D', E', F' and G', the median threshold voltages VTH are (6, 15, 21, 29, 36, 30, 40). The control circuit 22 takes these median threshold voltages VTH as accessing voltage. Subsequent reading the data, the control circuit 22 automatically accesses the data by the accessing voltage.

In summary, the storage system and the storage method shown in the present invention can define various error type patterns in advance through the retry table. When a data access error occurs, the control circuit can test each of the retry set of voltage shift values in sequence until the voltage shift value corresponding to the current error type is found, and the corresponding error type pattern corresponding to the voltage shift values is used to adjust the accessing action correspondingly. For example, the control circuit moves the repaired data to other memory blocks to avoid using bad memory blocks, or moves the repaired data to the cache to reduce the access loading of the flash memory, or based on the adjusted accessing voltage to read the data. When reading the data, the control circuit can directly read this data with the adjusted accessing voltage and reduce the number of searching the retry table. Therefore, the present invention achieves improving the speed of reaction in the event of an error in the storage system and provides a repair mechanism, thereby increasing the overall performance.

Although the present invention has been described in considerable detail with reference to certain embodiments thereof, other embodiments are possible. Therefore, the scope of the appended claims should not be limited to the description of the embodiments contained herein.

What is claimed is:

1. A storage system, comprising:
   a flash memory; and
   a controller, coupled to the flash memory, the controller comprising:
   a storage device, for storing a retry table; wherein the retry table recites a plurality of error type patterns, the error type patterns comprises a plurality of default error types; and
   a control circuit, for accessing data stored in the flash memory; wherein an access error caused when the control circuit reads the data, the control circuit reads the retry table and performs testing according to the error type patterns sequentially to determine a current error type of the access error, and the control circuit performs an adjusted accessing action according to the current error type.

2. The storage system of claim 1, wherein the default error types comprise a data retention type, and/or a read disturb type, and/or a higher temperature write and lower temperature read type.

3. The storage system of claim 2, wherein the data stored in a first memory block of the flash memory, and the storage system further comprising:
   a cache memory;
   when the current error type is the read disturb type, the control circuit corrects a content stored in the first memory block by the error-correcting code (ECC) algorithm and copies the content to a second memory block and/or the cache memory.

4. The storage system of claim 2, wherein the data stored in a first memory block of the flash memory;
   when the current error type is the data retention type, the control circuit copies a content stored in the first memory block to a second memory block.

5. The storage system of claim 2, wherein when the current error type is the higher temperature write and lower temperature read type or a lower temperature write and higher temperature read type, the control circuit adjusts an accessing voltage for reading the flash memory to read the correct data.

6. The storage system of claim 1, wherein when the control circuit reads the retry table, the control circuit adjusts an accessing voltage for reading the flash memory according to a plurality sets of voltage shift values in the error type patterns, and the control circuit performs testing by reading the data adjusted by each set of the voltage shift values sequentially until the control circuit reads the correct data; when the control circuit reads the correct data, the control circuits determines the current error type of the access error according to the corresponding error type pattern having the set of the voltage shift values that generated the correct data.

7. A storage method, comprising:
   storing a retry table; wherein the retry table recites a plurality of error type patterns, the error type patterns comprises a plurality of default error types;
   accessing data stored in the flash memory; wherein an access error caused when a control circuit reads the data, the control circuit reads the retry table and performs testing according to the error type patterns sequentially to determine a current error type of the access error, and the control circuit performs an adjusted accessing action according to the current error type.

8. The storage method of claim 7, wherein the default error types comprise a data retention type, and/or a read disturb type, and/or a higher temperature write and lower temperature read type.

9. The storage method of claim 8, wherein the data stored in a first memory block of the flash memory, and the storage method further comprising:
   when the current error type is the read disturb type, the control circuit corrects a content stored in the first memory block by the error-correcting code (ECC) algorithm and copies the content to a second memory block and/or a cache memory.

10. The storage method of claim 8, wherein the data stored in a first memory block of the flash memory, and the storage method further comprising:
    when the current error type is the data retention type, the control circuit copies a content stored in the first memory block to a second memory block.

11. The storage method of claim 8, wherein when the current error type is the higher temperature write and lower temperature read type or a lower temperature write and higher temperature read type, the control circuit adjusts an accessing voltage for reading the flash memory to read the correct data.

12. The storage method of claim 7, wherein when the control circuit reads the retry table, the control circuit adjusts an accessing voltage for reading the flash memory according to a plurality sets of voltage shift values in the error type patterns, and the control circuit performs testing by reading the data adjusted by each set of the voltage shift values sequentially until the control circuit reads the correct data; when the control circuit reads the correct data, the control circuits determines the current error type of the access error according to the corresponding error type pattern having the set of the voltage shift values that generated the correct data.

* * * * *